(12) United States Patent
Yu (10) Patent No.: US 6,381,553 B1
(45) Date of Patent: Apr. 30, 2002

(54) METHODS AND SYSTEMS FOR DETERMINING A BALL-GRID ARRAY SEATING PLANE

(75) Inventor: Dahai Yu, Redmond, WA (US)

(73) Assignee: Mitutoyo Corporation, Kawasaki (JP)

( * ) Notice: Subject to any disclaimer, the term of this patent is extended or adjusted under 35 U.S.C. 154(b) by 0 days.

(21) Appl. No.: 09/310,369

(22) Filed: May 12, 1999

(51) Int. Cl.[7] .............................................. G06F 15/00
(52) U.S. Cl. ...................... 702/150; 702/153
(58) Field of Search ..................... 702/113, 150–159, 702/166; 439/70; 438/14, 15, 107–109; 257/673; 29/843

(56) References Cited

U.S. PATENT DOCUMENTS

| | | | |
|---|---|---|---|
| 4,736,108 A | * 4/1988 | Comstock et al. | 250/559.34 |
| 5,331,406 A | * 7/1994 | Fishbaine et al. | 356/621 |
| 5,435,482 A | * 7/1995 | Variot et al. | 228/254 |
| 5,465,152 A | * 11/1995 | Bilodeau et al. | 356/602 |
| 5,556,293 A | * 9/1996 | Pfaff | 439/266 |
| 5,574,668 A | * 11/1996 | Beaty | 702/150 |
| 5,734,475 A | * 3/1998 | Pai | 356/620 |

OTHER PUBLICATIONS

Algorithm to Locate the Seating Plane of Surface–Mounted Devices, IBM Technical Disclosure Bulleting, May 1987, vol. 29, Issue No. 12, pp. 5461–5462.*
"Ball Grid Array Package," JEDEC Design Standard, No. 95–1, Section 14, pp. 14–1–14–18.

* cited by examiner

Primary Examiner—Marc S. Hoff
Assistant Examiner—Manuel L. Barbee
(74) Attorney, Agent, or Firm—Oliff & Berridge, PLC (57) ABSTRACT

The ball-grid array ball measuring system measures the distances between a reference plane and points on the surface of a small crown area of each of a plurality of balls within a ball-grid array. The points include the apex of each of the balls within the ball-grid array. These distances are then forwarded to the ball-grid array seating plane determining circuit. The ball-grid array seating plane determining circuit determines the ball-grid array seating plane in accordance with the JEDEC "Ball-grid Array Package" Standard. The determined ball-grid array seating plane consequently satisfies the needs for realizing calculations of dimensions and tolerances defined by the Standard.

30 Claims, 9 Drawing Sheets

METHODS AND SYSTEMS FOR DETERMINING A BALL-GRID ARRAY SEATING PLANE

BACKGROUND OF THE INVENTION

1. Field of Invention

This invention is related to determining the probable seating plane for an array of connection elements. In particular, this invention is directed to systems and methods for determining the seating plane of a ball-grid array.

2. Description of Related Art

As defined by the Joint Electron Device Engineering Council in the "Ball-grid Array Package" JEDEC STANDARD, No. 95-1, Section 14, (the Standard) incorporated herein by reference in its entirety, a ball-grid array is a square or rectangular area of metallized balls, columns or other connection structures formed on an array side of an integrated circuit package. The main body of the package has a metallized circuit pattern applied to a dielectric structure. One or more semiconductor dies are attached to a die side of the dielectric structure, which may be either the top or bottom surface of the dielectric structure. On the array side of the dielectric structure is an array pattern of the metallized balls, columns or other connection structures that form the mechanical and electrical connection from the package to a mating feature such as a printed circuit board. The surface which contains the semiconductor die may be encapsulated by various techniques to protect the semiconductor die.

The Standard defines a ball-grid array seating plane as the plane simulated by a horizontal surface that is in contact with the apices of three or more non-collinear balls that support the package when it is placed on the top of this surface. The triangle formed by the three or more balls defining the seating plane must include the center of gravity of the package. If multiple possible seating planes meet these conditions, then the potential seating plane with the worst coplanarity is defined as the actual seating plane, since this will emphasize the potential for "out of plane" connection elements to lead to a connection failure.

A seating plane is used as a very important reference when evaluating dimensions and tolerances of a ball-grid array, such as the thickness of the ball-grid array package body, coplanarity and warpage. However, there is no method for seating plane determination proposed in the standard.

SUMMARY OF THE INVENTION

As mentioned above, the seating plane is used as a reference when evaluating dimensions and tolerances. For instance, the Joint Electron Device Engineering Council has proposed one method for determining the ball-grid array coplanarity. In this method, coplanarity is the distance between the seating plane and the apex of the ball/column which is the furthest from the seating plane among all balls. However, there is not a method to determine the seating plane as proposed in the Standard.

As a substitute approach, a second method for determining coplanarity first establishes a least mean square plane. The least mean square plane is determined by calculating the least mean square of the distance between the spherical crowns of all the balls or columns of the ball-grid array. A shifted least mean square plane is then determined by shifting the least mean square plane along the direction normal to the least mean square plane and away from the ball-grid array package until the apex of the ball or column having the greatest distance from the original least mean square plane lies on the shifted least mean square plane. This plane is called lowest ball reference plane and used as a substitute for the defined seating plane in the case of a coplanarity calculation.

Actually this substitute "seating plane" is also used in cases of other dimension and tolerance calculations because there is no current method for determining the seating plane. Since the ball-grid array is becoming a major device in the semiconductor industry, there is a strong need for standards to guide design, manufacture and inspection and a need to comply with these standards.

The foregoing substitute methods do not consider the location of the center of gravity of the ball grid array. Furthermore, the least mean square plane by it's nature tends to pick a "least tilted" plane (the average plane) based on the entire array of balls, whereas the seating plane, by it's definition, is intended to contact only the apices of the balls. The tilt of a seating plane based on only on the most extreme apices has a high probability of being more tilted than the previously described least mean square plane. Furthermore, any measure of coplanarity, one of the most important parameters for determining ball grid array quality, depends very strongly on the tilt of the assumed seating plane. Thus, there is a strong need for a rigorous method of determining the seating plane as defined in the Standard.

This invention provides systems and methods that determine the ball-grid array seating plane in conformance with the Standard.

Accordingly, the systems and methods for determining the ball-grid array seating plane according to this invention enable a seating plane to be determined that is in accordance with the Joint Electron Device Engineering Council definition of "seating plane."

Specifically, a ball-grid array package is presented to a ball-grid array ball measuring system. The ball-grid array ball measuring system measures the distance from a reference plane to the apex of each of the balls. These distances are then forwarded to the ball-grid array seating plane determining system. The nominal center of gravity, which could be based on design data, may also be forwarded to the ball-grid array seating plane determining system. The ball-grid array seating plane determining system determines the ball-grid array seating plane in accordance with the Standard.

Although the following description of the exemplary embodiments of the systems and methods according to this invention refer to a ball grid array, it should be appreciated that this is an exemplary application of the invention. In general, the methods and systems of this invention can be used for determining stable seating planes for any device resting on the most extreme points included within an array of mechanical or electrical connection elements. The apices of a ball grid array are referred to in the following description. However, in general, the apices of any type of array of connection elements should be considered equivalent to the apices of a ball grid array.

These and other features and advantages of this invention are described in or are apparent from the following detailed description of the preferred embodiments.

BRIEF DESCRIPTION OF THE DRAWINGS

The preferred embodiments of the this invention will be described in detail, with reference to the following figures, wherein.

DETAILED DESCRIPTION OF PREFERRED EMBODIMENTS

The systems and methods of this invention allow for a precise identification of the seating planes that allow the ball grid array package to sit in a stable manner, and at least one seating plane according to the definition in the Standard for a ball-grid array package. A data set including the apices of all the balls of the ball-grid array is input to the ball-grid array seating plane system. The apex of each ball is nominally the point of that ball that is furthest from the array side of the ball-grid array package. Strictly, the apex of each ball is the point on that ball that is closest to the ultimately-determined seating plane. Thus, it may be necessary to measure a plurality of points on the small top crown area of each ball of the ball-grid array. This plurality of points should contain the apex of that ball. If only one point on each ball is measured, that point may not be the true apex, since the apex cannot be strictly determined before a seating plane is determined.

The ball-grid array seating plane system fits a series of candidate planes to the input data points. Each candidate plane can be defined by a triangle of three data points The ball-grid array seating plane system compares all candidate planes, and identifies the plane with the worst coplanarity, or the triangle having the largest area, as the seating plane. The ball-grid array seating plane with the worst coplanarity is in compliance with the definition in the Standard. The ball-grid array seating plane with the largest area triangle might be used in some particular applications as this plane possesses the maximum stability. The systems and methods of this invention can be easily applied with these two different criteria.

The methods and systems of this invention are also applicable to arrays of other types of connection elements on other electronic packages and substrates, and may generally be used whenever it is of interest to know which apices of a connector element array are the possible, or a likely, stable contact points for a mating array of connection points. That is, which apices of the connector element array determine the possible, or likely, seating planes for the connector element array. When a seating plane is known, the coplanarity of the connection element array may be determined, which provides an indication of whether all of the connection elements are likely to achieve reliable contact with a mating array of connection points, for a given assembly process.

Figure 1:
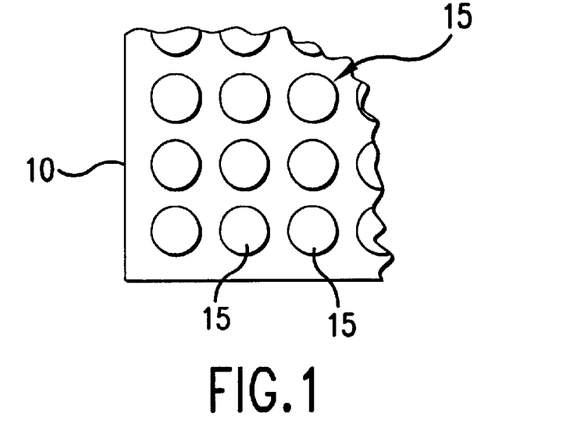
FIG. 1 is an exemplary array-side view of a portion of an exemplary ball-grid array package.

FIG. 1 is an array-side view of an exemplary portion of a ball-grid array package 10. The ball-grid array package 10 contains balls 15 attached to the array side of the ball-grid array package 10. These balls 15 form the mechanical and electrical connection from the ball-grid array package 10 to, for example, a printed circuit board.

Figure 2:
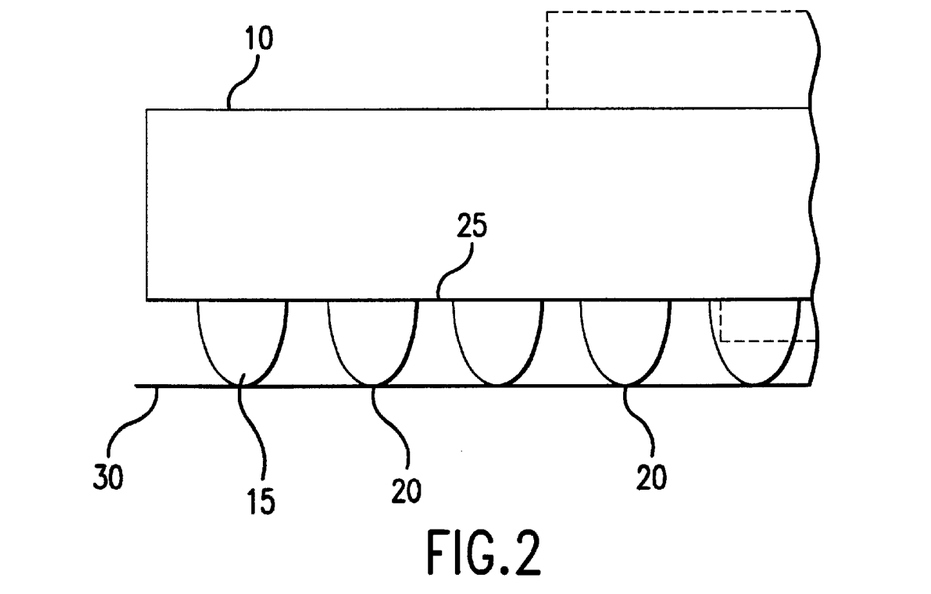
FIG. 2 is an exemplary side view of a portion of a ball-grid array package.

FIG. 2 is a side view of the portion of the ball-grid array package 10 shown in FIG. 1. As previously described, the balls 15 establish the mechanical and/or electrical connection between the ball-grid array package 10 and another surface, for example, a printed circuit board 30.

Each ball 15 of the ball-grid array package 10 is a three dimensional ball attached to an array side 25 of the ball-grid array package. Each of these balls 15 has an apex 20 which is furthest from the array side 25 of the ball-grid array package 10. The apices 20 of the balls 15 are the points of the balls 15 that are measured when determining the seating plane.

Figure 3:
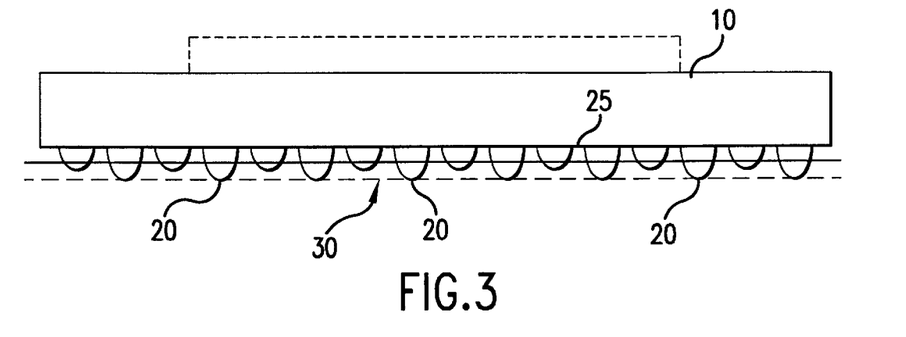
FIG. 3 illustrates a seating plane for an exemplary ball-grid array package.
Figure 4:
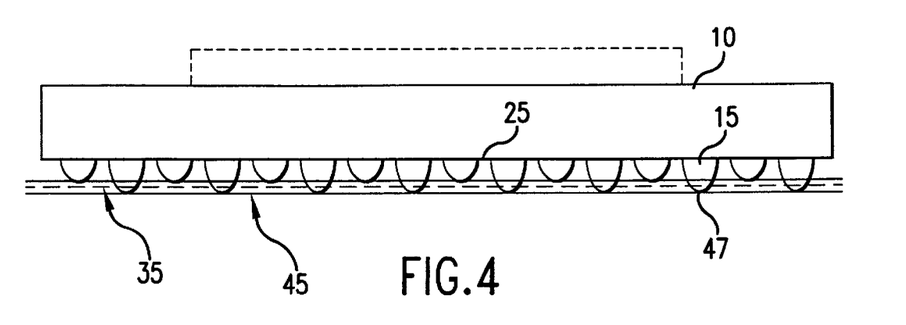
FIG. 4 illustrates a least mean square plane and a shifted least mean square plane for an exemplary ball-grid array package.

FIG. 3 illustrates a ball-grid array package 10 having a seating plane 30. This seating plane 30 is obtained by establishing a plane that passes through three or more apices 20 that are furthest from the array side 25 of the ball-grid array package 10. FIG. 4 illustrates a ball-grid array package 10 with a lowest ball reference plane 45 that is obtained by shifting a least means square plane 35 in a first direction normal to the least mean square plane 35 and away from the array side 25 of the ball-grid array package 10 until the shifted least mean square plane 45 contacts the apex 47 of the ball 15 that is furthest away from the least mean square plane 35 in the first direction. This plane is commonly used as a substitute for the seating plane in semiconductor applications.

Figure 5:
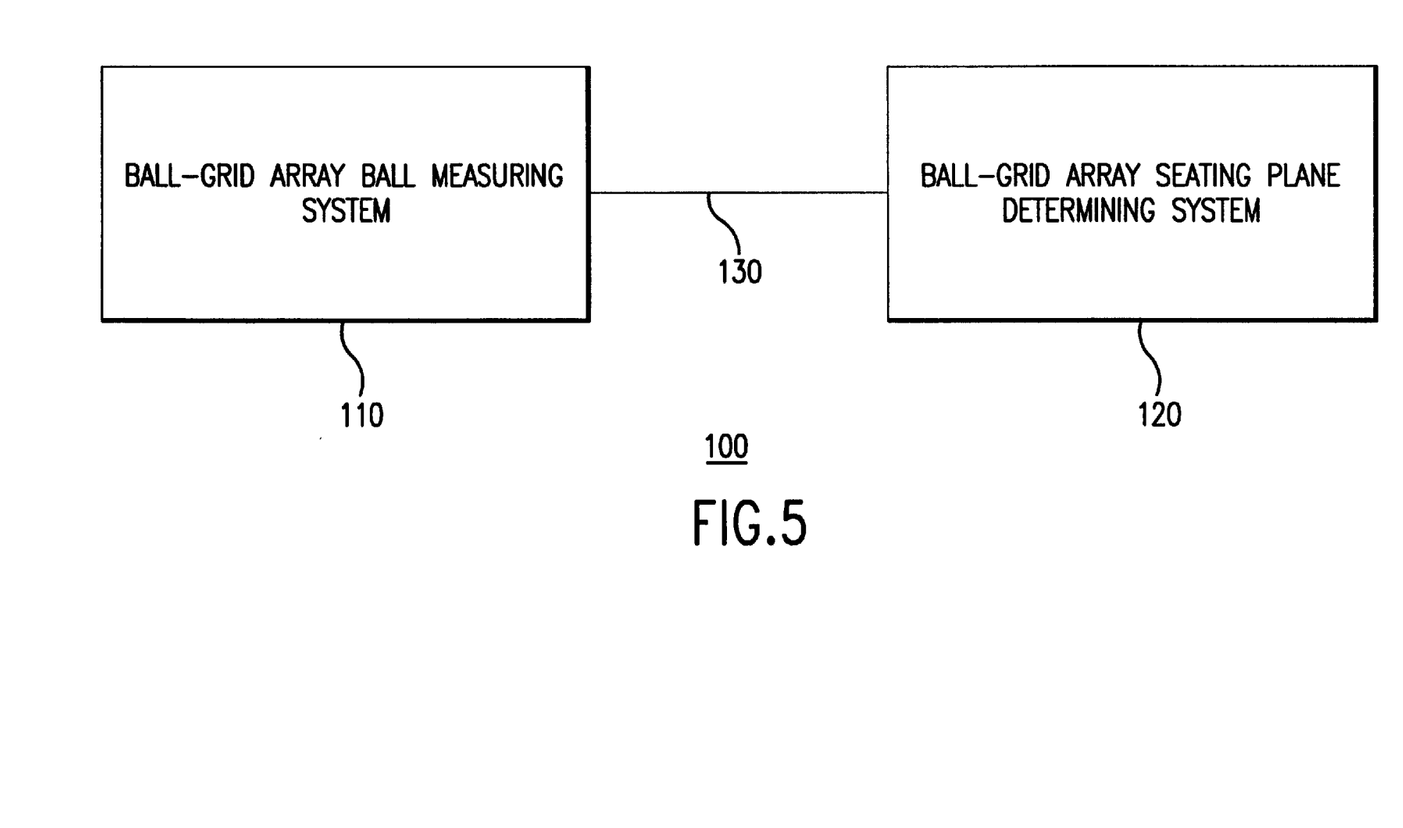
FIG. 5 is a functional block diagram showing the ball-grid array seating plane system.

FIG. 5 illustrates a ball-grid array seating plane system 100. The ball-grid array seating plane system 100 comprises a ball-grid array ball measuring system 110 and a ball-grid array seating plane determining system 120 connected by a link 130. The ball-grid array measuring system 110 determines a set of data points corresponding to the apices of each of the ball-grid array package balls 15 and defines a distance from each of the apices of the balls to a reference plane. Upon determining a data point for each of these balls, the data, i.e., the distance from the apices of the balls to the reference plane, is forwarded over the link 130 to the ball-grid array seating plane determining system 120. The ball-grid array seating plane determining system 120 determines the seating plane based on a plane defined by three or more of the data points that have the worst coplanarity and/or the largest area of the resulting triangle.

Figure 6:
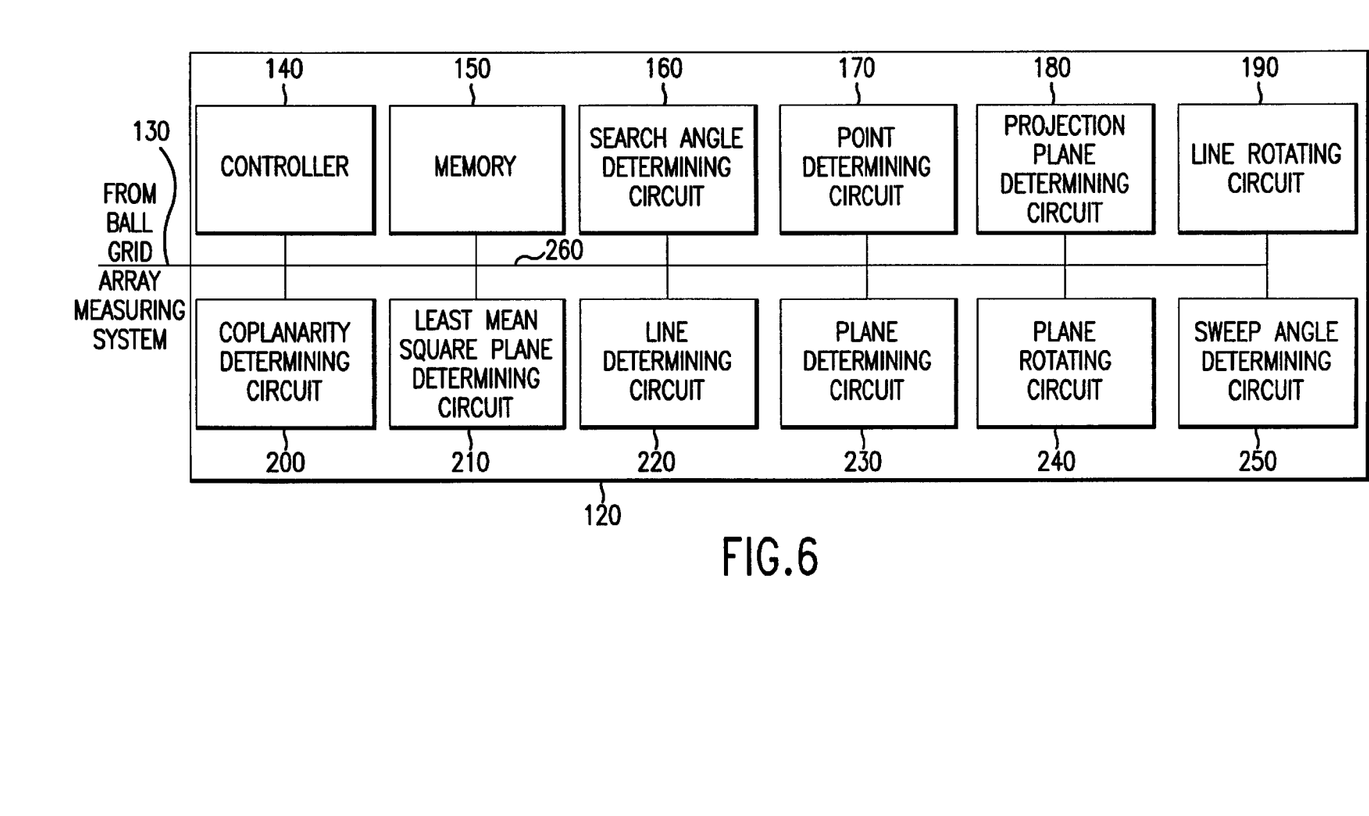
FIG. 6 is a functional block diagram illustrating the ball-grid array seating plane determining system of FIG. 1 in greater detail.

FIG. 6 illustrates in greater detail one exemplary embodiment of the ball-grid array seating plane determining system 120. Specifically, in this exemplary embodiment, the ball-grid array seating plane determining system 120 comprises a controller 140, a memory 150, a search angle determining circuit 160, a point determining circuit 170, a projection plane determining circuit 180, a line rotating circuit 190, a coplanarity determining circuit 200, a least mean square plane determining circuit 210, a line determining circuit 220, a plane determining circuit 230, a plane rotating circuit 240 and a sweep angle determining circuit 250, all connected by a data/control bus 260. The ball-grid array seating plane determining system 120 receives the set of data points from the ball-grid array measuring system 110 over the link 130.

Figure 7:
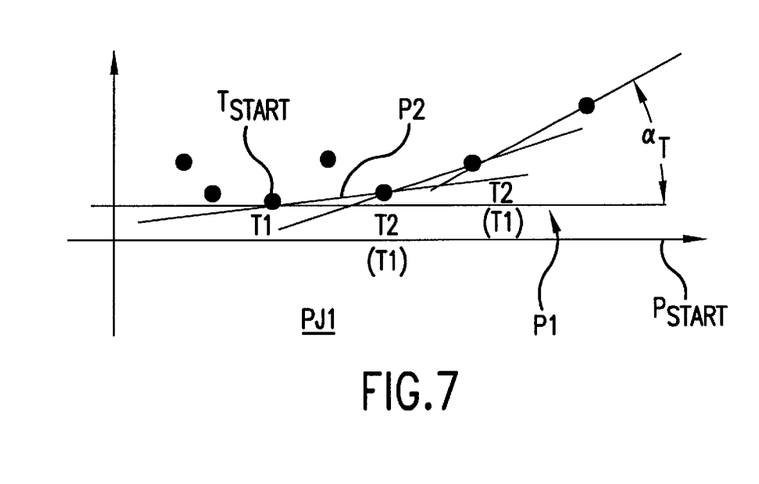
FIGS. 7–10 illustrate the operation of the ball-grid array seating plane determining system.

With reference to FIG. 7, the set of data points is input to the ball-grid array seating plane determining system 120 and stored in the memory 150. At the direction of the controller 140, the least mean square plane determining circuit 210 determines a least mean square plane $P_{START}$ for the set of data points. The least mean square plane determining circuit 210 then shifts the least mean square plane $P_{START}$ to contact the data point $T_{START}$ that is furthest from the least mean square plane, in a direction that is normal to the least mean square plane and away from the array side 25 of the ball-grid array package 10. This is an exemplary plane. In general, any $P_{START}$ plane that includes one data point furthest away from the array side 25 of the ball-grid array package in a direction normal to the plane, such that all other data points lie on the side of that plane toward the substrate of the connection elements, can be used. The line determining circuit 220 then arbitrarily establishes an initial line $L_R$ in the shifted least mean square plane $P_{START}$. The sweep angle θ, stored in the memory 150, and the search angle α, stored in the memory 150, are both set to 0 at the beginning of processing. Then, the plane determining circuit 230 sets a test plane P1 equal to the shifted least mean square plane $P_{START}$ and the point determining circuit 170 sets a first test point T1 equal to the furthest data point $T_{START}$.

The line determining circuit 220 then creates an arbitrary line L1 in the test plane P1 that passes through the first test point T1. The line rotating circuit 190 rotates the test line L1 until the angle between the test line L1 and the initial line $L_R$ is equal to the sweep angle θ.

Figure 8:
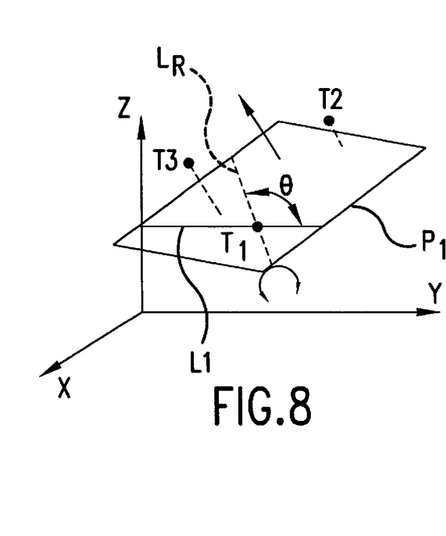

As shown in FIG. 8, the projection plane determining circuit 180 then establishes a first projection plane PJ1 that is perpendicular to both the test plane P1 and the first test line L1. The projection plane determining circuit 180, in cooperation with the point determining circuit 170 and the memory 150, then projects the data points and the test plane P1 onto the first projection plane PJ1. The plane determining circuit 230, using the test point T1 as a pivot point, rotates the test plane P1, which becomes a line after it has been projected into the first projection plane PJ1, in a chosen direction, such as a counter-clockwise direction in the first projection plane PJ1 until the test plane P1 contacts a second test point T2 within the projection plane PJ1.

Figure 9:
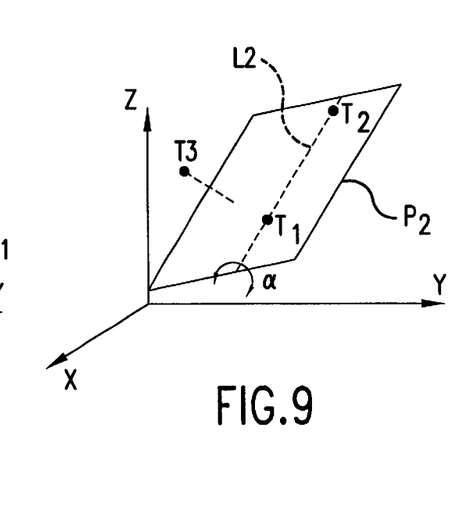

The second test point T2 is then stored in the memory 150. Then, as shown in FIG. 9, the line determining circuit 220 defines a second test line L2 that passes through the first and second test points T1 and T2. The controller 140 then sets a second test plane P2 equal to the rotated first test plane P1.

It should be noted that the arbitrary line L1, the sweep angle θ, the test plane P1, the first projection plane PJ1, the second test line L2, and the other accompanying constructs, as well as the "rotations" described above, form an exemplary systematic method for establishing a second test plane, but not the only method. The "rotations" described herein are simply one way of describing or visualizing the conditions that the second test plane needs to fulfill in order to support this exemplary systematic method. The effect of a "rotation" may be achieved without actually implementing rotation as a search method in a computing algorithm. For example, the second test plane can be directly established as a plane perpendicular to the first projection plane that includes the furthest data point, and the point whose projection into the first projection plane lies closest to the projection of the first test plane into the first projection plane. In general, the second test plane is a plane that contacts both the furthest data point and a second data point, all other data points lying on a single side of the plane, where the furthest data point and the second data point are furthest from the substrate in a direction normal to the test plane. For purposes of supporting a systematic searching procedure in the following steps, the preferred second test plane also lies at the smallest rotation angle relative to the first test plane, hence the use of the term "rotation" in relation to a plane used in the above-outlined description of an exemplary method. Any method that identifies such a second test plane is acceptable and useful in this systematic method.

The search angle determining circuit 160 then sets the search angle α equal to α plus the angle in the projection plane PJ1 between the first test plane P1 and the second test plane P2. The search angle determining circuit 160 then determines if the search angle α is greater than a preset threshold search angle $α_T$. If the search angle α is greater than the preset threshold search angle α, the search angle determining circuit 160 resets the search angle to zero, while the sweep angle determining circuit 250 sets the sweep angle θ to:

$$θ=θ+Δθ,$$

where:

θ is the sweep angle; and

Δθ is a preset sweep angle increment.

The sweep angle determining circuit 250 then checks whether the sweep angle θ is greater than 360°. If the sweep angle θ is greater than 360°, in this exemplary procedure searching for additional seating planes stops and the plane having either the worst coplanarity and/or a triangle having the largest area is selected as the seating plane, as discussed below.

If the search angle α is not greater than the preset threshold search angle $α_T$, the projection plane determining circuit 180 establishes a second projection plane PJ2 that is perpendicular to the second test plane P2 and the second test line L2. The projection plane determining circuit 180, in cooperation with the point determining circuit 170 and the memory 150, then projects the data points and the second test plane P2 into the projection plane PJ2.

Figure 10:
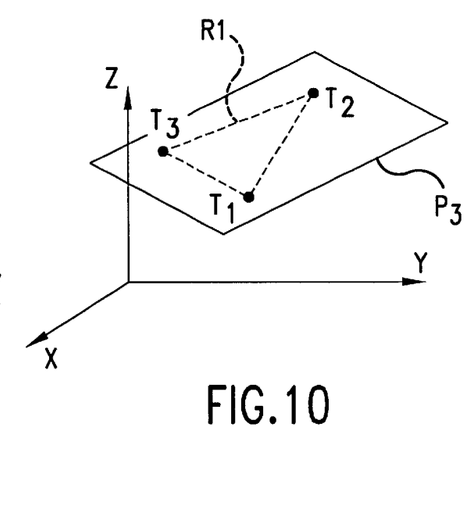

The second test line L2 is then projected into the second projection plane PJ2 as a point, while the second test plane P2 is projected into the second projection plane PJ2 as a line. The plane rotating circuit 240 rotates the projected second test plane P2 in the second projection plane PJ2 using the projected second test line L2 as a pivot. In particular, as shown in FIG. 10, the plane rotating circuit 240 rotates the projected second test plane P2 about the projected second test line L2 in a chosen direction, such as a counter-clockwise direction until the projected second test plane P2 contacts a third test point T3. The plane determining circuit 230 then uses the test points T1, T2 and T3 to define a third test plane P3.

Then, the plane rotating circuit 240 rotates the projected test plane P2 in the opposite direction in the second projection plane PJ2 using the projected second test line L2 as a pivot. In particular, the plane rotating circuit 240 rotates the projected second test plane P2 about the projected second test line L2 in a clockwise direction, if the previously chosen direction was counter-clockwise, until the projected second test plane P2 contacts a fourth test point T4 (not shown). The plane determining circuit 230 then uses the test points T1, T2 and T4 to define a fourth test plane P4 (not shown).

It should be noted that the second projection plane PJ2, and other accompanying constructs, as well as the "rotations" described above, form an exemplary systematic method for establishing third and fourth test planes. The "rotations" described herein are simply one way of describing or visualizing the conditions that the third and fourth test planes need to fulfill in order to support this exemplary systematic method. The effect of a "rotation" may be achieved without actually implementing rotation as a search method in a computing algorithm. For example, the third test plane can be directly established to be a plane that includes the furthest data point, the second data point, and the point whose projection into the second projection plane lies closest to the second test plane. In general, the third and fourth test planes are planes that contact the furthest data point, the second data point, and a third data point, with all other data points lying on a single side of the plane, where the farthest data point and the second and third data points are furthest from the substrate in a direction normal to the test plane. Furthermore, for purposes of supporting a systematic searching procedure in the following steps, the preferred third and fourth test planes are also the two planes which lie at the smallest rotation angles relative to the second test plane. Any method that identifies such third and fourth test planes is acceptable and useful in this systematic method.

Next, in this exemplary method, the coplanarity determining circuit 200 checks the triangle R1 formed by the test points T1, T2 and T3 and the triangle R2 formed by the test points T1, T2 and T4 to determine if either the triangle R1 and/or the triangle R2 contains the center of gravity of the ball-grid array package 10. A center of gravity is defined as the fixed point in a material body through which the resultant force of gravitational attraction acts. Thus, the center of gravity of the ball-grid array package 10 is a point within the ball-grid array package 10 through which the resultant force of gravitational attraction acts. In other words, the center of gravity of the ball-grid array package 10 is a point within the ball-grid array package 10 at which all of the gravitational forces on the ball-grid array package 10 would be balanced if the ball-grid array package 10 were suspended from that point.

A triangle formed by the test points "contains" the center of gravity of the ball-grid array package 10 when a line that passes through the center of gravity of the ball-grid array package 10 and that is normal to the test plane containing that triangle also passes through an edge or the interior of the triangle.

For each triangle R1 and/or R2 that contains the center of gravity, the area of that triangle R1 and/or R2, and/or the coplanarity of the test plane P3 or P4 that contains that triangle R1 or R2 that contains the center of gravity, is determined and stored. However, if both of the triangles R1 and R2 are determined to contain the center of gravity, the triangle R1 or R2 with the larger area and/or the corresponding test plane P3 or P4 having the greater coplanarity is used. Thus, the test plane P3 or P4 having the greater coplanarity and/or containing the triangle R1 or R2 having the greater area is stored in the memory 150 as the current potential seating plane S.

In this exemplary systematic method, the plane determining circuit 170 then replaces the first test point T1 with the second test point T2 and the plane determining circuit 170 replaces the first test plane P1 with the second test plane P2 and repeats the above-outlined procedure. That is, the second test point T2 becomes the first test point T1, and the second test plane P2 becomes the first test plane P1 for the next iteration of the above-described procedure. The line determining circuit 220 then creates a new first test line L1 that passes through the first test point T1 and that is parallel to a line rotated away from the initial line $L_R$ in the initial first test plane P1 by the sweep angle θ. As illustrated in FIG. 8, the process is then repeated from the point when the projection plane determining circuit 180 forms the first projection plane PJ1.

However, as previously noted and as shown in FIG. 8, if the search angle determining circuit 160 determines, after projecting the data points into the first projection plane PJ1, that the search angle α is greater than a preset threshold search angle $α_T$, the sweep angle determining circuit 250 sets the sweep angle θ equal to the current sweep angle θ plus a preset increment Δθ. The sweep angle determining circuit 250 then determines if the sweep angle θ is greater than 360°. If the sweep angle is less than 360°, the system resets itself by setting the test plane P1 equal to the shifted least mean square plane $P_{START}$ and setting the first test point T1 equal to the data point $T_{START}$. The search angle α is then set to zero and the process is repeated until the sweep angle θ monitored by the sweep angle determining circuit 250 exceeds 360°.

Upon the sweep angle determining circuit 250 determining that the sweep angle θ is greater than 360°, the controller 140 retrieves from memory 150 the potential seating plane S having the greatest coplanarity and/or having a triangle formed by the corresponding points $T_1$, $T_2$ and $T_3$ or $T_4$ having the greatest area. This potential seating plane S is selected as the actual seating plane S.

Figure 11A:
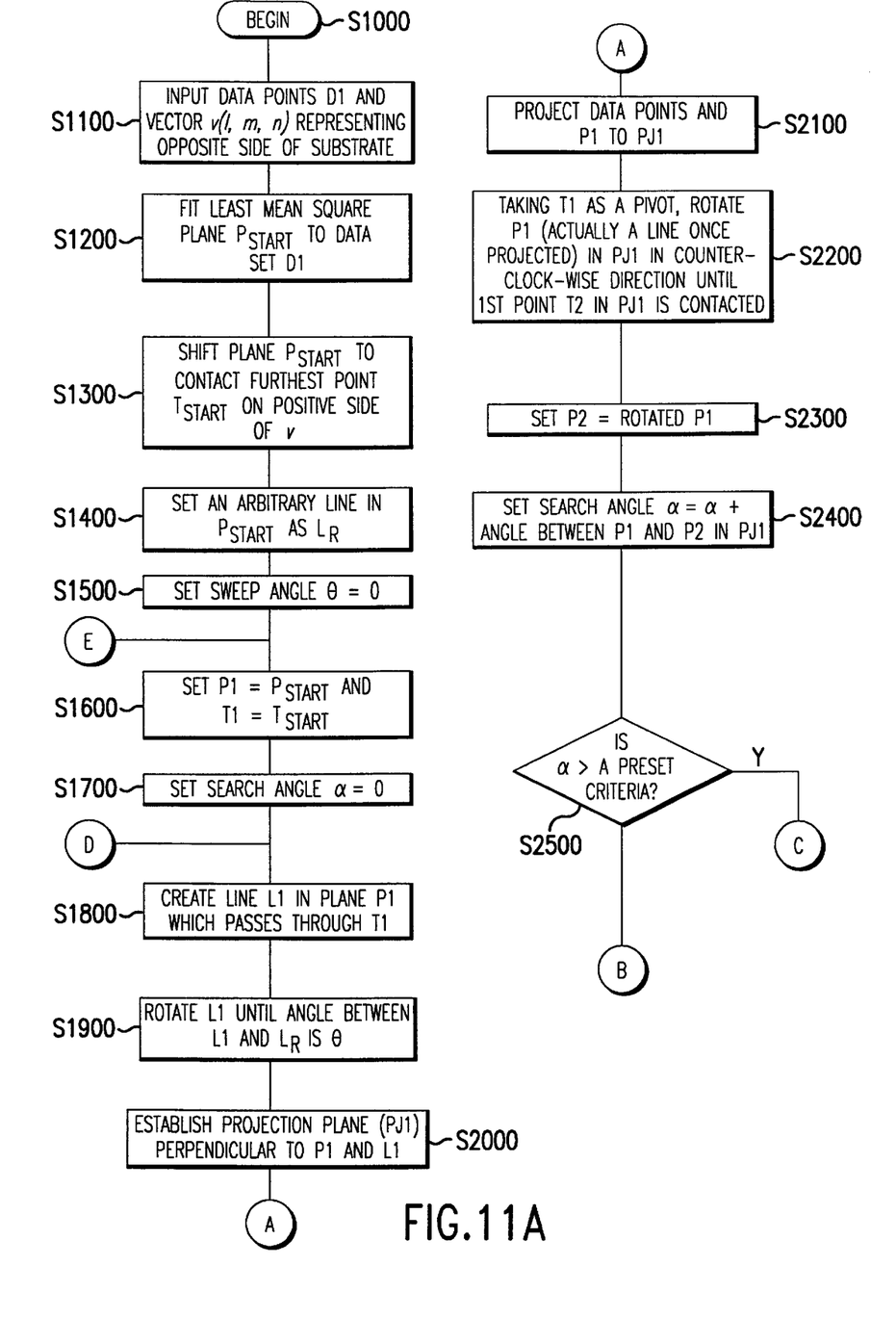
FIGS. 11A–11C is a flowchart outlining one exemplary embodiment of a method for determining the ball-grid array seating plane according to this invention.
Figure 11B:
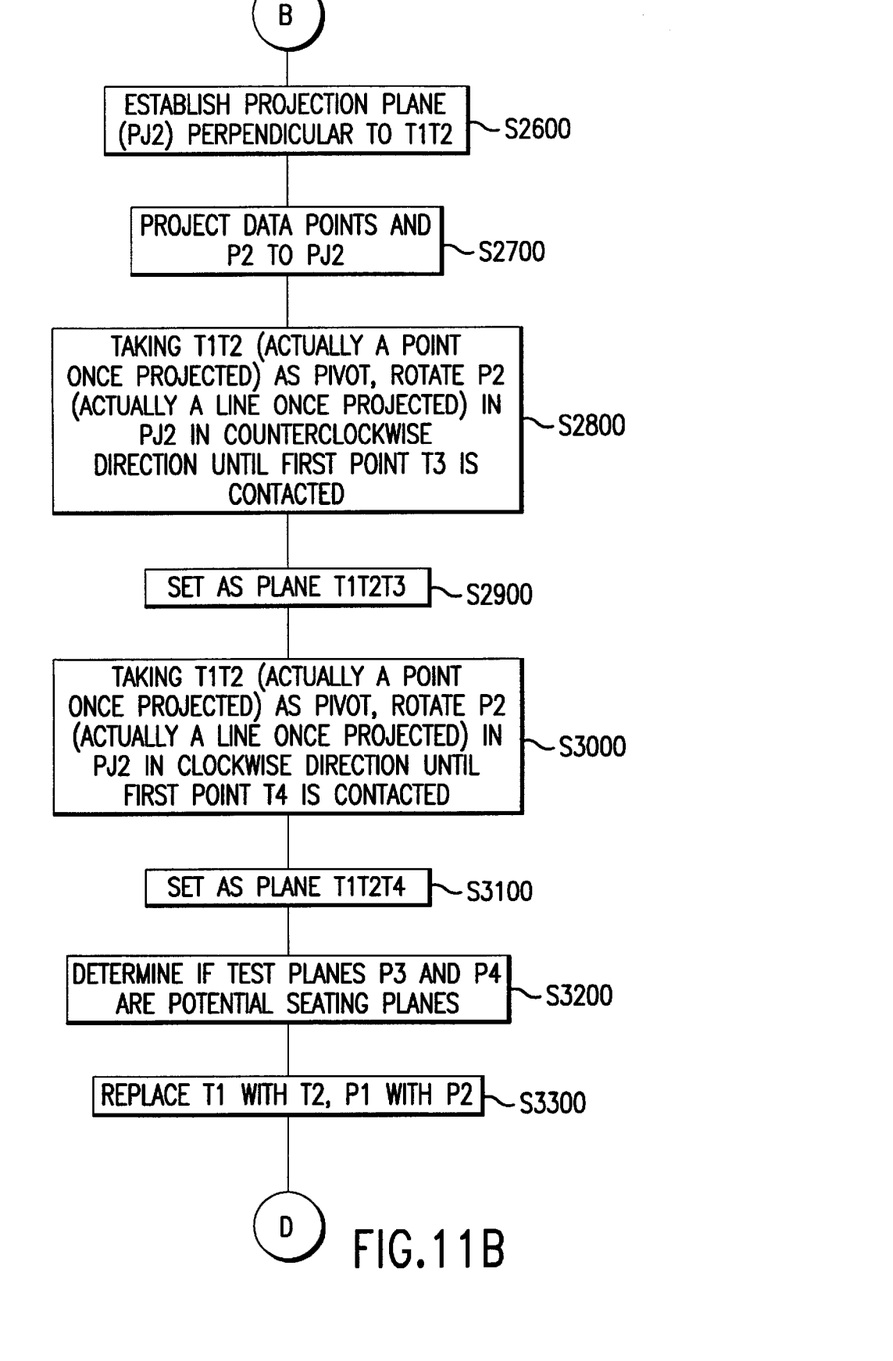
Figure 11C:
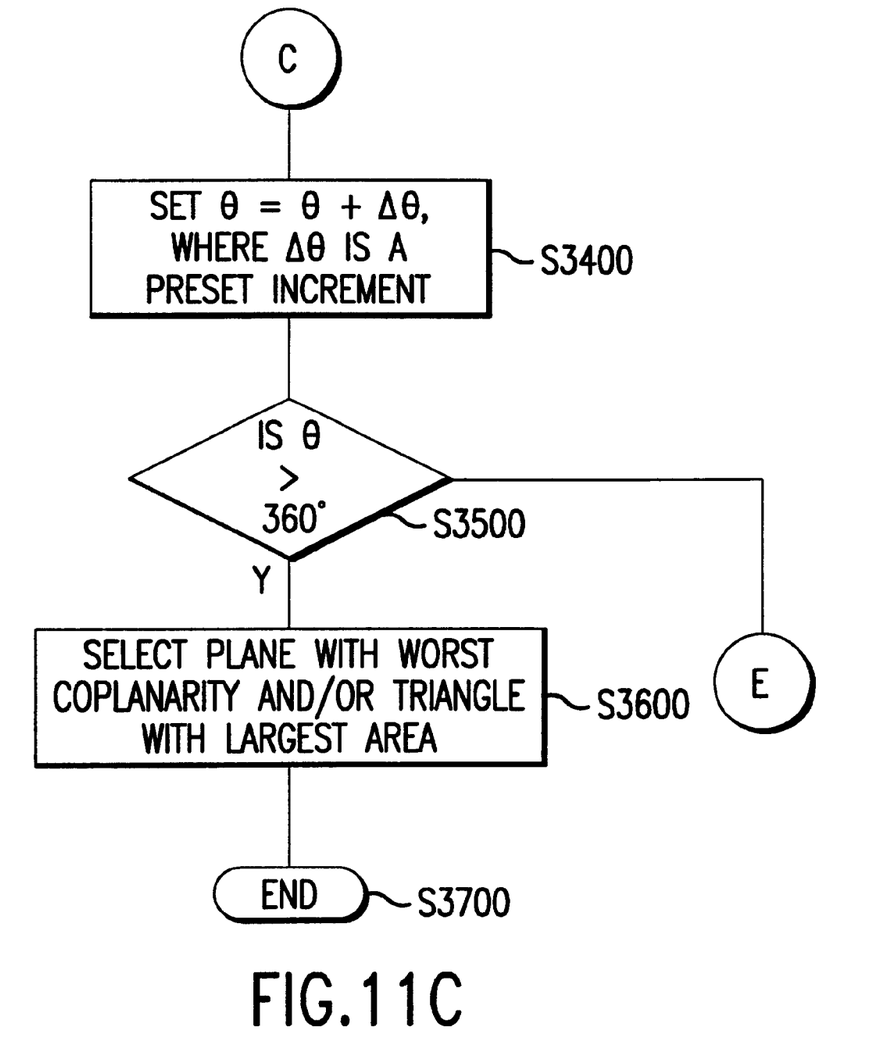

FIGS. 11A–11C is a flowchart outlining one exemplary embodiment of the method for determining a seating plane according to this invention. Control begins in step S1000. In step S1100, the data points, i.e., the lateral positions of the apices and the distance from the apices of the balls to the reference plane, are input. Next, in step S1200, a least mean square plane $P_{START}$ for the set of data points is determined. Then, in step S1300, the least mean square plane $P_{START}$ is shifted along a line normal to the least mean square plane $P_{START}$ until the least mean square plane $P_{START}$ contacts the data point $T_{START}$ that is furthest from the least mean square plane in the normal direction and away from the array side 25 of the ball-grid array package 10. Control then continues to step S1400.

In step S1400, an initial line $L_R$ is arbitrarily established in the shifted least mean square plane $P_{START}$. Next, in step S1500, the sweep angle θ is set to 0. Then, in step S1600, the test plane P1 is set to the shifted least mean square plane $P_{START}$ and the first point T1 is set to the furthest data point $T_{START}$. Control then continues to step S1700.

In step S1700, the search angle α is set to 0. Next, in step S1800, a line L1 is created in the test plane P1 which passes through the first test point T1. Next, in step S1900, the test line L1 is rotated until the angle between the test line L1 and the initial line $L_R$ is equal to the sweep angle θ. Then, in step S2000, a projection the plane PJ1 is established that is perpendicular to both the test plane P1 and the first test line L1. Control then continues to step S2100.

In step S2100, the data points and the test plane P1 are projected onto the first projection plane PJ1. Next, in step S2200, using the first test point T1 as a pivot, the test plane P1, which is actually a line once projected into the first projection plane PJ1, is rotated in a counter-clockwise direction in the first projection plane PJ1 until the test plane P1 contacts a second test point T2 within the projection plane PJ1. Then, in step S2300, a second test plane P2 is set equal to the rotated first test plane P1. Control then continues to step S2400.

In step S2400, the search angle α is set equal to the search angle α plus the angle in the projection plane PJ1 between the first test plane P1 and the second test plane P2. Next, in step S2500, a determination is made whether the search angle α is greater than a preset threshold search angle $α_T$. If the search angle α is greater than a preset threshold search angle $α_T$, control jumps to step S3400. Otherwise, control continues to step S2600.

In step S2600, a second projection plane PJ2 is established that is perpendicular to a second test line L2 formed by the test point T1 and the test point T2. Next, in step S2700, the data points, the second test plane P2 and the second test line L2 are projected into the second projection plane PJ2. In particular, the second test plane L2 is projected into the second projection plane PJ2 as a point, while the second test plane P2 is projected into the second projection plane PJ2 as a line. Then, in step S2800, the projected second test plane P2 is rotated in the second projection plane PJ2 using the projected second test line L2 as a pivot. In particular, the projected second test plane P2 is rotated about the projected second test line L2 in a counter-clockwise direction until the projected second test plane P2 contacts a third test point T3. Then, in step S2900, the test points T1, T2 and T3 are used to define a third test plane P3. Control then continues to step S3000.

In step S3000, the projected test plane P2 is rotated in the second projection plane PJ2 clockwise about the projected second test line L2 as a pivot. In particular, the projected second test plane rotated P2 about the projected second test line L2 in a clockwise direction until the projected second test plane P2 contacts a fourth test point T4. Next, in step S3100, the test points T1, T2 and T4 are used to define a fourth test plane P4. Then, in step S3200, the triangle R1 formed by the test points T1, T2, and T3 and the triangle R2 formed by the test points T1, T2 and T4 are checked to see if either or both contain the center of gravity of the ball-grid array. Then, in step S3300, the first test point T1 is replaced with the second test point T2 and the first test plane P1 with the second test plane P2. That is, the second test point T2 becomes the first test point T1, and the second test plane P2 becomes the first test plane P1. Control then jumps back to step S1800.

In step S3400, the sweep angle θ is set equal to the sweep angle θ plus a preset sweep angle increment Δθ. Next, in step S3500, a determination is made whether the sweep angle θ is greater than 360°. If the sweep angle θ is not greater than 360°, control jumps back to step S1600. Otherwise, control continues to step S3600. In step S3600, the test plane having the worst coplanarity and/or containing the triangle having the greatest area defined by the points T1, T2 and either T3 or T4 and is selected as the seating plane S. The points defining this triangle also defines the seating plane S. Control then continues to step S3700 where the control sequence ends.

Figure 12:
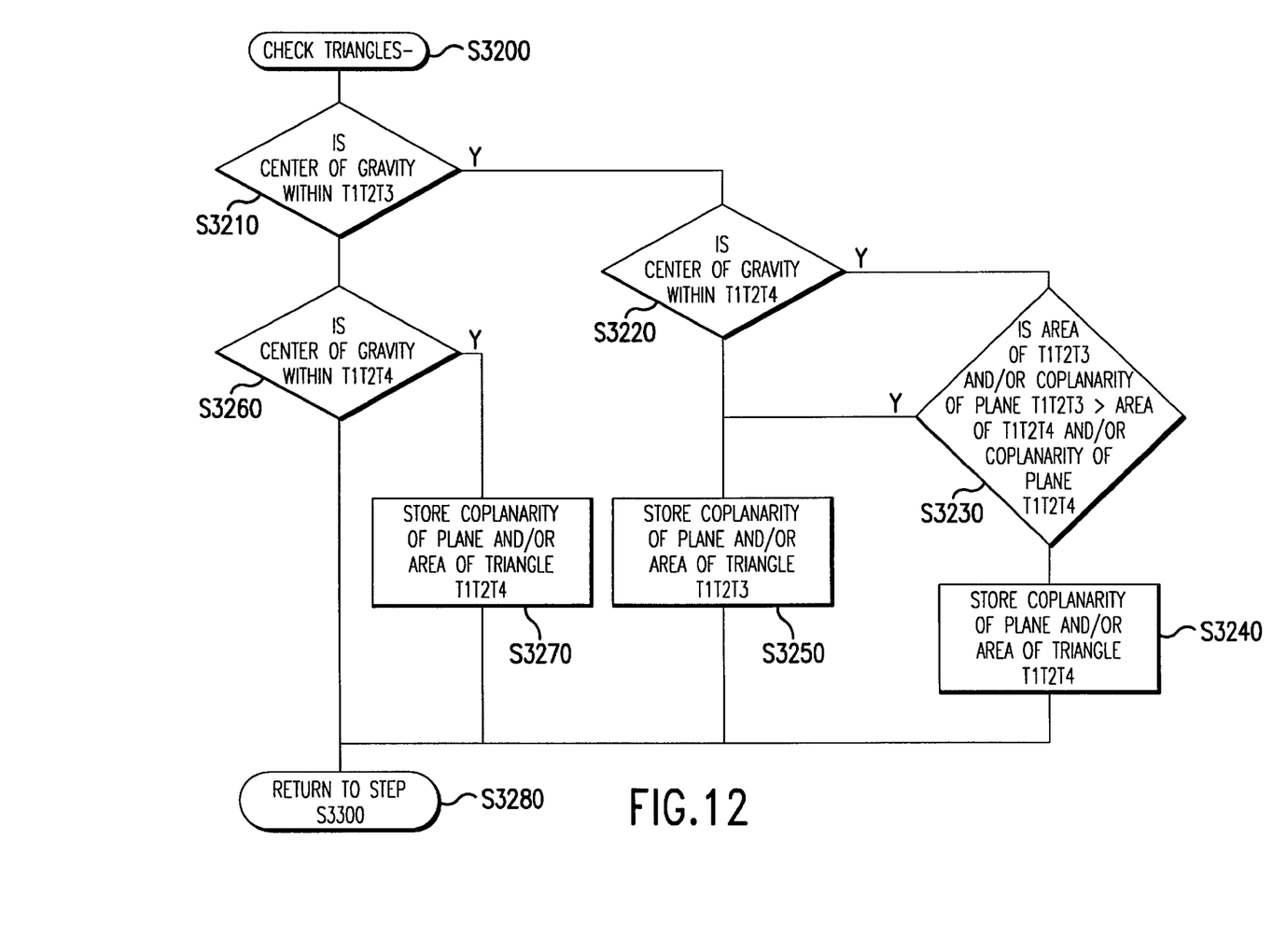
FIG. 12 is a flowchart outlining in greater detail one exemplary embodiment of the potential seating plane determining step of FIG. 11B.

FIG. 12 illustrates in greater detail the potential seating plane determining step S3200 of FIG. 11B. As shown in FIG. 12, control begins in step S3200. Next, in step S3210, a determination is made whether the center of gravity is contained within the triangle R1 formed by the test points T1, T2 and T3. If the center of gravity is contained within the triangle R1, control continues to step S3220. Otherwise, control jumps to step S3260.

In step S3220, a determination is made whether the center of gravity is also contained within the triangle R2 formed by the test points T1, T2 and T4. If the center of gravity is also within the triangle R2, control continues to step S3230. Otherwise, control jumps to step S3250.

In step S3230, a determination is made whether the area of the triangle R1 is greater than the area of the triangle R2 and/or if the coplanarity of the plane defined by the triangle R1 is worse than the coplanarity of the plane defined by the triangle R2. If the area of triangle R1 is greater than the area of triangle R2 and/or if the coplanarity of the plane defined by the triangle R1 is worse than the coplanarity of the plane defined by triangle R2, control jumps to step S3650. Otherwise, control continues to step S3240.

In step S3240, the test plane P4, and the area corresponding to the triangle R2, is stored as the potential seating plane. Control then jumps to step S3280. In contrast, in step S3250, the test plane P3, and the corresponding area to the triangle R1, is stored as the potential seating plane. Control then jumps to step S3280.

In step S3260, a determination is made whether the center of gravity falls within the triangle R2. If the center of gravity is within the triangle R2, control continues to step S3270. Otherwise, control jumps to step S3280, where control returns to step S3300. In step S3270, the area of the triangle R2 and/or the coplanarity of the plane formed by the triangle R2 is stored. Control then continues to step S3280.

As shown in FIGS. 5 and 6, the ball-grid array seating plane determining system 120 is preferably implemented on a program and general purpose computer. However, the ball-grid array seating plane determining system 120 can also be implemented on a special purpose computer, a programmed microprocessor or microcontroller and peripheral integrated circuit element, an ASIC or other integrated circuit, a digital signal processor, a hard wired electronic or logic circuit such as a discrete element circuit, a programmable logic device such as a PLD, PLA, FPGA or PAL, or the like. In general, any device, capable of implementing a finite state machine that is in turn capable of implementing the flowcharts as shown in FIGS. 11A–11C and 12 can be used to implement the ball-grid array seating plane determination system 120.

The links 130 and 260 can be any wired or wireless link, or any known element that is capable of supplying electronic data to and from the connected elements.

It should be appreciated that after determining and shifting the least mean square plane $P_{START}$ to contact the furthest data point $T_{START}$, that more than one furthest data point may be on the shifted least mean square plane $P_{START}$. If this occurs, for reasons of computational efficiency, the above method can be modified to provide more efficient processing. In particular, in the case where three or more data points fall on the shifted least mean square plane $P_{START}$, the three data points that make the largest triangle are selected. If the center of gravity falls within this triangle, the triangle is saved as being a potential seating plane. Processing then continues in accordance with above-outlined procedure by arbitrarily establishing an initial line $L_R$ in the shifted least mean square plane $P_{START}$ and selecting the point which allows for rotating of the shifted least mean square plan while maintaining all the data points on one side of the shifted least mean square plane.

Alternatively, if two points are immediately located on the shifted least mean square plane $P_{START}$, these two points can immediately be set as the line L2. Processing would then continue as outlined above by rotating the line L2 until the angle between the line L2 and the initial line $L_R$ is equal to the sweep angle θ. Selection of the second text point T2 would then be accomplished by selecting the point which allows for rotation of the shifted least means square plane while maintaining all the data points on one side of the shifted least mean square plane.

While this invention has been described in conjunction with the exemplary embodiments outlined above, it is evident that many alternatives, modifications and variations will be apparent to those skilled in the art. For example, the electronic connection elements whose apices are analyzed need not necessarily be those of a conventional ball grid array. Any array of connection elements such as pins, surface mount connection pads, spring-contact connection elements, or the like may be similarly analyzed. Furthermore, the connection elements may be located on a discrete electronic package, a silicon wafer, a silicon die, a printed circuit board, a hybrid circuit, or the like. Furthermore, the foregoing exemplary method of searching for potential seating planes of practical significance is a systematic and computationally efficient method. However, many of the plane identification teachings included herein are still useful if applied in conjunction with other methods for exhaustive searching and screening, such as those allowing redundant computations, point-by-point computations, trial and error screening, and the like. Accordingly, the preferred embodiments of the invention as set forth above, are intended to be illustrative, not limiting. Various changes may be made without departing from the spirit and scope of the invention.

What is claimed is:

1. A system that identifies at least one seating plane for an array of connection elements attached to a substrate, each at least one seating plane being defined by a plane that coincides with at least some of a plurality of input data points obtained from the connection elements such that each seating plane coincides with at least three data points, three of the at least three data points form a triangle in the seating plane, all the data points not included in the seating plane lie between the seating plane and the substrate, and the triangle encompasses the center of gravity of the connection elements and substrate, the system comprising:

a seating plane determining circuit that determines at least one test plane that is a potential seating plane and that selects at least one seating plane from the determined at least one test plane, wherein:

for each of the at least one test plane that is a potential seating plane, at least three of the data points coincide with that test plane and form a triangle in that test plane, wherein the triangle formed in that test plane does not necessarily encompass the center of gravity, and the seating plane determining circuit determines, for each such test plane, at least two of the data points forming the triangle in that test plane in conjunction with determining that test plane, such that the at least three data points that coincide with that test plane and that form the triangle are insured to be the most extreme data points in a direction normal to that determined test plane and away from the substrate.

2. The system of claim 1, wherein the connection elements are the connection elements of a ball grid array.

3. The system of claim 1, wherein the substrate comprises one of a discrete electronic package, a silicon wafer, a silicon die, a printed circuit board, and a hybrid circuit.

4. The system of claim 1, wherein the substrate comprises a discrete electronic package, and wherein the seating plane determining circuit selects seating planes wherein the projection of the center of gravity normal to the seating plane lies within the triangle of data points.

5. The system of claim 4, wherein the discrete electronic package comprises a ball grid array package.

6. The system of claim 1, wherein the seating plane determining circuit selects the at least one seating plane which is associated with a worst coplanarity for the plurality of input data points.

7. The system of claim 1, wherein the seating plane determining circuit selects the at least one seating plane which is associated with the triangle having a largest area.

8. The system of claim 1, wherein, for at least some of the connection elements, at least two data points are obtained from a single connection element and a test plane may include two data points obtained from a single connection element.

9. A method of identifying at least one seating plane for an array of connection elements attached to a substrate, each at least one seating plane being defined by a plane that coincides with at least some of a plurality of input data points obtained from the connection elements such that each seating plane coincides with at least three data points, three of the at least three data points form a triangle in the seating plane, all the data points not included in the seating plane lie between the seating plane and the substrate, and the triangle encompasses the center of gravity of the connection elements and substrate, the method comprising:

determining at least one test plane which is a potential seating plane; and selecting the at least one seating plane from the determined at least one test plane which is a potential seating plane, wherein:

each such test plane which is a potential seating plane coincides with at least three data points which form a triangle in the seating plane, wherein the triangle formed in that test plane does not necessarily the center of gravity, and determining the test plane comprises determining at least two of the data points which form the triangle in conjunction with determining the test plane which is a potential seating plane, such that it is insured that the test plane coincides with at least three data points which are the most extreme data points in a direction normal to the determined test plane and away from the substrate.

10. The method of claim 9, wherein the substrate comprises an electronic circuit package and the selecting step comprises selecting the at least one seating plane from those test planes wherein the projection of the center of gravity normal to the test plane lies within the triangle of data points.

11. The method of claim 9, wherein the selecting step comprises determining which of the at least one seating planes is associated with a worst coplanarity for the input data set.

12. The method of claim 9, wherein the selecting step comprises determining which of the at least one seating planes is associated with the triangle having a largest area.

13. The method of claim 9, wherein the test plane determining step further comprises determining a first preliminary test plane to contact a furthest data point, all other data points lying on a single side of the first preliminary test plane, the furthest data point being the most extreme data point in a direction normal to the first preliminary test plane and away from the substrate.

14. The method of claim 13, wherein the test plane determining step further comprises determining a second preliminary test plane in conjunction with determining a second data point such that the second preliminary test plane coincides with both the furthest data point and the second data point, the furthest data point and the second data point being the most extreme data points in a direction normal to the second preliminary test plane and away from the substrate.

15. The method of claim 14, wherein the second preliminary test plane determining step comprises:

establishing a first rotation axis in the first preliminary test plane that passes through the furthest data point;

establishing a first projection plane perpendicular to the first preliminary test plane and the first rotation axis, projecting the plurality of input data points in a direction normal to the first projection plane onto the first projection plane to establish a set of first projected data points; and determining the second preliminary test plane such that the second preliminary test plane is equivalent to rotating the first preliminary test plane about the first rotation axis in a chosen direction until the second preliminary test plane contacts the second data point, the second data point being the first projected data point which positions the second preliminary test plane at the smallest rotation angle relative to the first preliminary test plane.

16. The method of claim 14, wherein the test plane determining step further comprises determining a test plane in conjunction with determining a third data point such that the test plane coincides with the furthest data point, the second data point, and a third data point, the furthest data point, the second data point and the third data point being the most extreme data points in a direction normal to the test plane and away from the substrate.

17. The method of claim 16, wherein the test plane determining step further comprises:
establishing a second rotation axis in the second preliminary test plane that passes through the furthest data point and the second data point;
establishing a second projection plane perpendicular to the second preliminary test plane and the second rotation axis;
projecting the plurality of input data points in a direction normal to the second projection plane onto the second projection plane to establish a set of second projected data points; and
determining a first test plane such that the first test plane is equivalent to rotating the second preliminary test plane about the second rotation axis in a first chosen direction until the first test plane contacts the third data point, the third data point being the one of the second projected data points which positions the first test plane at a first smallest rotation angle relative to the second preliminary test plane.

18. The method of claim 17, wherein the test plane determining step further comprises determining a second test plane such that the second test plane is equivalent to rotating the second preliminary test plane about the second rotation line in a second chosen direction opposite to the first chosen direction until the second test plane contacts a fourth data point, the fourth data point being the one of the second projected data points which positions the second test plane at a second smallest rotation angle relative to the second preliminary test plane.

19. The method of claim 18, wherein the test plane determining step further comprises determining another test plane of the at least one test plane by repeating the entire test plane determining step with a new first preliminary test plane set equal to the second preliminary test plane, a new furthest data point set equal to the second data point, and with a new first rotation axis lying in the new first preliminary test plane and passing through the new furthest data point and parallel to the previous first rotation axis.

20. The method of claim 19, wherein the determining step further comprises repeating the entire test plane determining step until the angle of the first preliminary test plane relative to a selected reference plane exceeds a predetermined threshold.

21. The method of claim 20, wherein the test plane determining step further comprises repeating the entire test plane determining step with a new first rotation axis lying in the original first preliminary test plane and passing through the original furthest data point, and the new first rotation axis rotated relative to the original first rotation axis by a predetermined increment in a chosen direction.

22. The method of claim 21, wherein the test plane determining step further comprises repeating the entire test plane determining step until an accumulated angle of the first rotation axis relative to the original first rotation axis exceeds a predetermined threshold.

23. The method of claim 9, wherein, for at least some of the connection elements, at least two data points are obtained from a single connection element and a test plane can include two data points obtained from a single connection element.

24. A computer program product comprising:
a computer usable storage medium having computer readable code embodied therein for causing a computer to serve as a seating plane determiner, the computer readable code comprising:
a computer readable program code configured to cause the computer to identify at least one seating plane for an array of connection elements attached to a substrate, each at least one seating plane being defined by a plane that is fit to a plurality of input data points including the apices of the connection elements, wherein the computer readable program code is configured to determine at least one seating plane for the connection elements, each determined seating plane including at least three apices, three of the at least three apices forming a triangle in the seating plane, and all the apices not included in the seating plane lying between the seating plane and the substrate; and
a computer readable program code configured to cause the computer to determine which of the at least one seating planes is associated with the triangle having a largest area.

25. The computer program product of claim 24, wherein the substrate comprises an electronic circuit package and the computer readable program code further comprises computer readable program code configured to select the at least one seating plane those test planes wherein the projection of the center of gravity normal to the test plane lies within the triangle of data points.

26. The computer program product of claim 25, the computer readable program code further comprising computer readable program code configured to determine which of the at least one seating planes is associated with a worst coplanarity for the input data set.

27. A system that identifies at least one seating plane for an array of connection elements attached to a substrate, each at least one seating plane being defined by a plane that is fit to at least some of a plurality of input data points, the plurality of data points including the apices of the connection elements, the system comprising:
a seating plane determining circuit that determines at least one seating plane for the electronic connection elements, each determined seating plane including at least three data points of the plurality of data points, three of the at least three data points forming a triangle in the seating plane, and all data points of the plurality of data points that are not included in the seating plane lying on one side of the seating plane;
wherein the seating plane determining circuit further determines which of the at least one seating planes is associated with the triangle having a largest area.

28. A method of identifying at least one seating plane for an array of connection elements attached to a substrate, each at least one seating plane being defined by a plane that is fit to at least some of a plurality of input data points, the plurality of data points including the apices of the connection elements, the method comprising:
determining at least one seating plane for the connection elements, each determined seating plane including at least three data points of the plurality of data points, three of the at least three data points forming a triangle in the seating plane, and all data points of the plurality of data points that are not included in the seating plane lying between the seating plane and the substrate; and determining which of the at least one seating planes is associated with the triangle having a largest area.

29. A computer program product comprising:

a computer usable storage medium having computer readable code embodied therein for causing a computer to serve as a seating plane determiner, the computer readable code comprising:

a computer readable program code configured to cause the computer to identify at least one seating plane for an array of connection elements attached to a substrate, each at least one seating plane being defined by a plane that coincides with at least some of a plurality of input data points obtained from the connection elements such that each seating plane coincides with at least three data points, three of the at least three data points form a triangle in the seating plane, all the data points not included in the seating plane lie between the seating plane and the substrate, and the triangle encompasses the center of gravity of the connection elements and the substrate, the computer readable program code comprising:

computer readable program code configured to cause the computer to determine at least one test plane which is a potential seating plane; and computer readable program code configured to cause the computer to select the at least one seating plane from the determined at least one test plane which is a potential seating plane, such that each such test plane which is a potential seating plane coincides with at least three data points which form a triangle in the seating plane, wherein the triangle formed in that test plane does not necessarily encompass the center of gravity, wherein the computer readable program code configured to cause the computer to determine at least one test plane determines at least two of the data points which form the triangle in conjunction with determining the test plane which is a potential seating plane, such that it is insured that the test plane coincides with at least three data points which are the most extreme data points in a direction normal to the determined test plane and away from the substrate.

30. The computer program product of claim 29, wherein, for at least some of the connection elements, at least two data points are obtained from a single connection element and a test plane can include two data points obtained from a single connection element.

\* \* \* \* \*